US012086697B2

(12) United States Patent
Kisamori et al.

(10) Patent No.: US 12,086,697 B2
(45) Date of Patent: Sep. 10, 2024

(54) RELATIONSHIP ANALYSIS DEVICE, RELATIONSHIP ANALYSIS METHOD, AND RECORDING MEDIUM FOR ANALYZING RELATIONSHIP BETWEEN A PLURALITY OF TYPES OF DATA USING KERNEL MEAN LEARNING

(71) Applicant: NEC CORPORATION, Tokyo (JP)

(72) Inventors: Keiichi Kisamori, Tokyo (JP); Keisuke Yamazaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 450 days.

(21) Appl. No.: 15/734,779

(22) PCT Filed: Jun. 7, 2019

(86) PCT No.: PCT/JP2019/022727
§ 371 (c)(1),
(2) Date: Dec. 3, 2020

(87) PCT Pub. No.: WO2019/235614
PCT Pub. Date: Dec. 12, 2019

(65) Prior Publication Data
US 2021/0232957 A1 Jul. 29, 2021

(30) Foreign Application Priority Data

Jun. 7, 2018 (JP) ................................ 2018-109880

(51) Int. Cl.
*G06N 20/10* (2019.01)
*G06F 17/18* (2006.01)
(Continued)

(52) U.S. Cl.
CPC ............. *G06N 20/10* (2019.01); *G06F 17/18* (2013.01); *G06N 7/00* (2013.01); *G06N 20/00* (2019.01)

(58) Field of Classification Search
CPC .......... G06N 20/10; G06N 20/00; G06N 7/00; G06F 17/18
See application file for complete search history.

(56) References Cited

U.S. PATENT DOCUMENTS 9,858,534 B2 * 1/2018 Abu-Mostafa ........ G06F 18/211
2018/0082204 A1 * 3/2018 Iwamasa ................ G05B 17/02
(Continued)

FOREIGN PATENT DOCUMENTS

JP 11-296561 A 10/1999
JP 2005-135287 A 5/2005
(Continued)

OTHER PUBLICATIONS

Muandet, Krikamol "Kernel Mean Embedding of Distributions: A Review and Beyond" Jan. 25, 2017, arXiv: 1605.09522v3, pp. 1-147. (Year: 2017).*

(Continued)

*Primary Examiner* — Miranda M Huang
*Assistant Examiner* — Chase P. Hinckley
(74) *Attorney, Agent, or Firm* — Sughrue Mion, PLLC

(57) ABSTRACT

A relationship analysis device includes a parameter sample data calculation unit that calculates sample data for parameters for a simulator that receives inputs of data of a first type and outputs data of a second type, calculating sample data; a second type sample data acquisition unit that inputs, to the simulator, observation data and sample data, and obtains sample data of the second type; and a parameter value determination unit that calculates a weight for sample data based on the difference between observation data of the second type and the sample data of the second type, and based on the relationship between a first distribution that the observation data of the first type followed and a second distribution being a distribution of the data of the first type, (Continued)

and calculates a value for the parameters using the calculated weight.

6 Claims, 10 Drawing Sheets

(51) Int. Cl.
  *G06N 7/00* (2023.01)
  *G06N 20/00* (2019.01)

(56) References Cited

U.S. PATENT DOCUMENTS

| | | | | |
|---|---|---|---|---|
| 2018/0349158 | A1* | 12/2018 | Swersky | G06N 20/00 |
| 2019/0242608 | A1* | 8/2019 | Laftchiev | G05B 13/048 |
| 2019/0370646 | A1* | 12/2019 | Rana | G06N 7/01 |
| 2021/0193255 | A1* | 6/2021 | Kamneva | G16B 20/20 |
| 2021/0224664 | A1* | 7/2021 | Kisamori | G06F 30/27 |
| 2021/0232737 | A1* | 7/2021 | Kisamori | G06Q 10/04 |
| 2021/0232738 | A1* | 7/2021 | Kisamori | G06N 5/02 |

FOREIGN PATENT DOCUMENTS

| | | | |
|---|---|---|---|
| JP | 2008-008772 A | | 1/2008 |
| JP | 2008-009548 A | | 1/2008 |
| JP | 2010-092266 A | | 4/2010 |
| JP | 2010-122832 A | | 6/2010 |
| JP | 2012-149920 A | | 8/2012 |
| JP | 2016-218869 A | | 12/2016 |
| JP | 2018-018451 A | | 2/2018 |
| JP | 2018-049390 A | | 3/2018 |
| WO | 2012/165517 A1 | | 12/2012 |
| WO | 2016/031174 A1 | | 3/2016 |
| WO | 2016/194051 A1 | | 12/2016 |
| WO | 2019/069865 A1 | | 4/2019 |
| WO | WO-2019167603 A1 | * | 9/2019 |

OTHER PUBLICATIONS

Nishiyama et al., "Model-based Kernel Sum Rule: Kernel Bayesian Inference with Probabilistic Models" Apr. 5, 2018, arXiv: 1409.5178v2, pp. 1-35. (Year: 2018).*

Kajihara et al., "Kernel Recursive ABC: Point Estimation with Intractable Likelihood" Feb. 23, 2018, arXiv:1802.08404v1, pp. 1-25. (Year: 2018).*

Kisamori et Yamazaki, "Intractable Lieklihood for Covariate Shift by Kernel Mean Embedding" Sep. 21, 2018, arXiv: 1809.08159v1, pp. 1-9. (Year: 2018).*

Mitrovic et al., "DR-ABC: Approximate Bayesian Computation with Kernel-Based Distribution Regression" Feb. 15, 2016, arXiv: 1602.04805v1, pp. 1-10. (Year: 2016).*

Kumar et al., "Trainable Calibration Measures for Neural Networks from Kernel Mean Embeddings" 2018, pp. 1-10. (Year: 2018).*

Kouw et Loog, "Effects of sampling skewness of the importance-weighted risk estimator on model selection" Apr. 19, 2018, arXiv: 1804.07344v1, pp. 1-6. (Year: 2018).*

Jiang et al., "Approximate Bayesian Computations with Kullback-Leibler Divergence as Data Discrepancy" Mar. 31, 2018, pp. 1-11. (Year: 2018).*

Jean et al., "Semi-supervised Deep Kernel Learning: Regression with Unlabeled Data by Minimizing Predictive Variance" May 26, 2018, arXiv: 1805.10407v1, pp. 1-14. (Year: 2018).*

Kanagawa, Motnobu, "Empirical representations of probability distributions via kernel mean embeddings" Mar. 2016, pp. i-108. (Year: 2016).*

Sasaki et al., "Neural-Kernelized Conditional Density Estimation" Jun. 5, 2018, arXiv: 1806.01754v1, pp. 1-12. (Year: 2018).*

Arbel et Gretton, "Kernel Conditional Exponential Family" Apr. 8, 2018, arXiv: 1711.05363v1, pp. 1-25. (Year: 2018).*

Phillips et Tai, "Improved Coresets for Kernel Density Estimates" Oct. 11, 2017, arXiv: 1710.04325v1, pp. i-13. (Year: 2017).*

Kouw et Loog, "On Regularization Parameter Estimation under Covariate Shift" Jul. 31, 2016, arXiv: 1608.00250v1, pp. 1-6. (Year: 2016).*

Wang et Rudin, "Extreme Dimension Reduction for Handling Covariate Shift" Mar. 12, 2018, arXiv: 1711.10938v2, pp. 1-12. (Year: 2018).*

Zennaro et Chen, "On the Use of Sparse Filtering for Covariate Shift Adaptation" Sep. 11, 2017, arXiv: 1607.06781v2, pp. 1-40. (Year: 2017).*

Kouw, Wouter "On domain adaptive machine learning" 2018. (Year: 2018).*

International Search Report of PCT/JP2019/022727 dated Aug. 27, 2019 [PCT/ISA/210].

International Search Report for PCT/JP2019/022710 dated Sep. 10, 2019 [PCT/ISA/210].

Office Action issued Mar. 26, 2024 in U.S. Appl. No. 15/734,913.

Kenji Fukumizu, et al., "Kernel Bayes' rule: Bayesian inference with positive definite kernels," The Journal of Machine Learning Research, 2013, vol. 14, pp. 3753-3783 (31 pages total).

Arthur Gretton, et al. "Covariate shift by kernel mean matching," 2008, pp. 1-38 (38 pages total).

Song, et al., "Hilbert Space Embeddings of Conditional Distributions with Applications to Dynamical Systems" Proceedings of the 26th International Conference on Machine Learning, Canada, 2009, pp. 961-968 (8 pages).

Junfeng Wen, et al., "Correcting Covariate Shift with Frank-Wolfe Algorithm", Twenty-fourth International Joint Conference on Artificial Intelligence, 2015, pp. 1010-1016 (7 pages).

United States Office Action dated Jul. 15, 2024 in U.S. Appl. No. 15/734,913.

* cited by examiner

RELATIONSHIP ANALYSIS DEVICE, RELATIONSHIP ANALYSIS METHOD, AND RECORDING MEDIUM FOR ANALYZING RELATIONSHIP BETWEEN A PLURALITY OF TYPES OF DATA USING KERNEL MEAN LEARNING

CROSS REFERENCE TO RELATED APPLICATIONS

This application is a National Stage of International Application No. PCT/JP2019/022727, filed Jun. 7, 2019, claiming priority to Japanese Patent Application No. 2018-109880, filed Jun. 7, 2018, the contents of all of which are incorporated herein by reference in their entirety.

TECHNICAL FIELD

The present invention relates to a relationship analysis device, a relationship analysis method, and a recording medium.

BACKGROUND ART

In a field such as simulation or machine learning, processing may be performed according to the characteristics of input data such as peculiarities of input data.

For example, Patent Document 1 describes a simulation device for performing high-resolution and high-precision simulation over a wide range in consideration of observation data that is non-ideal, and observation data with discontinuity or specificity. This simulation device simulates a time evolution of a state vector based on an initial state and parameters of the state vector in the simulation, and selects observation data to be used from among plurality of pieces of observation data based on the information related to the state vector. Then, this simulation device, based on the state vector and the selected observation data, generates a first posterior distribution based on all pieces of the observation data or a second posterior distribution based on missing observation data, and unifies the first and second posterior distributions. Then, the simulation device determines which of the second posterior distribution or the unified posterior distribution is to be used.

Further, Patent Document 2 describes a learning device that simplifies the calculation procedure for learning a prediction model. This learning device learns a prediction model for predicting the output of test data based on importance that is a ratio of the generation probability of training data, which are input data of training sample data, and the test data. At the time of learning, this learning device learns a prediction model using an importance-weighted loss function, which is a loss function considering importance.

PRIOR ART DOCUMENTS

Patent Document

[Patent Document 1] Re-publication of PCT International Publication No. 2016-031174
[Patent Document 2] Japanese Unexamined Patent Application, First Publication No. 2010-092266

SUMMARY OF THE INVENTION

Problem to be Solved by the Invention

In an analysis of the relationship between plurality of types of data, the relationship to be extracted may be different depending on whether the relationship in the entire data is analyzed or the relationship in some areas is analyzed. When analyzing the relationship in some areas, it is possible to weight the observation data according to the areas, for example, using a regression analysis method.

However, in general regression analysis, a model based on a differentiable function is used, and the values of model parameters (function coefficients) are learned by machine learning. For that reason, if the model is unknown (for example, if the function used as the model cannot be referenced), the regression analysis method cannot be applied.

One example of an object of the present invention is to provide a relationship analysis device, a relationship analysis method, and a recording medium that can solve the above problems.

Means for Solving the Problems

According to a first example aspect of the present invention, a relationship analysis device includes: a parameter sample data calculation unit that calculates a plurality of pieces of sample data for parameters for a simulator that receives inputs of data of a first type and outputs data of a second type, calculating the plurality of pieces of sample data based on a temporarily set distribution for the parameters; a second type sample data acquisition unit that inputs, to the simulator, observation data of the first type and each of the plurality of pieces of sample data for the parameters, and obtains sample data of the second type for each of the plurality of pieces of sample data for the parameters; and a parameter value determination unit that calculates a weight for each of the plurality of pieces of sample data for the parameters based on the difference between observation data of the second type and the sample data of the second type, and based on the relationship between a first distribution that the observation data of the first type followed and a second distribution being a distribution of the data of the first type and indicating a region for which a relationship is to be found, and calculates a value for the parameters using the calculated weight.

According to a second example aspect of the present invention, a relationship analysis method includes calculating a plurality of pieces of sample data for parameters for a simulator that receives inputs of data of a first type and outputs data of a second type, calculating the plurality of pieces of sample data based on a temporarily set distribution for the parameters; inputting, to the simulator, observation data of the first type and each of the plurality of pieces of sample data for the parameters, and calculating sample data of the second type for each of the plurality of pieces of sample data for the parameters; calculating a weight for each of the plurality of pieces of sample data for the parameters based on the difference between observation data of the second type and the sample data of the second type, and based on the relationship between a first distribution that the observation data of the first type followed and a second distribution being a distribution of the data of the first type and indicating a region for which a relationship is to be found; and calculating a value for the parameters using the calculated weight.

According to a third example aspect of the present invention, a recording medium records a program for causing a computer to execute calculating a plurality of pieces of sample data for parameters for a simulator that receives inputs of data of a first type and outputs data of a second type, calculating the plurality of pieces of sample data based on a temporarily set distribution for the parameters; inputting, to the simulator, observation data of the first type and each of the plurality of pieces of sample data for the parameters, and calculating sample data of the second type for each of the plurality of pieces of sample data for the parameters; calculating a weight for each of the plurality of pieces of sample data for the parameters based on the difference between observation data of the second type and the sample data of the second type and based on the relationship between a first distribution that the observation data of the first type followed and a second distribution being a distribution of the data of the first type and indicating a region for which a relationship is to be found; and calculating a value for the parameters using the calculated weight.

Effect of the Invention

According to an example embodiment of the present invention, it is possible to deal with relationship analysis even when the model is unknown.

EXAMPLE EMBODIMENTS

Hereinbelow, example embodiments of the present invention will be described, but the following example embodiments do not limit the invention according to the claims. Moreover, not all combinations of features described in the example embodiments are essential for the invention.

First Example Embodiment

Figure 1:
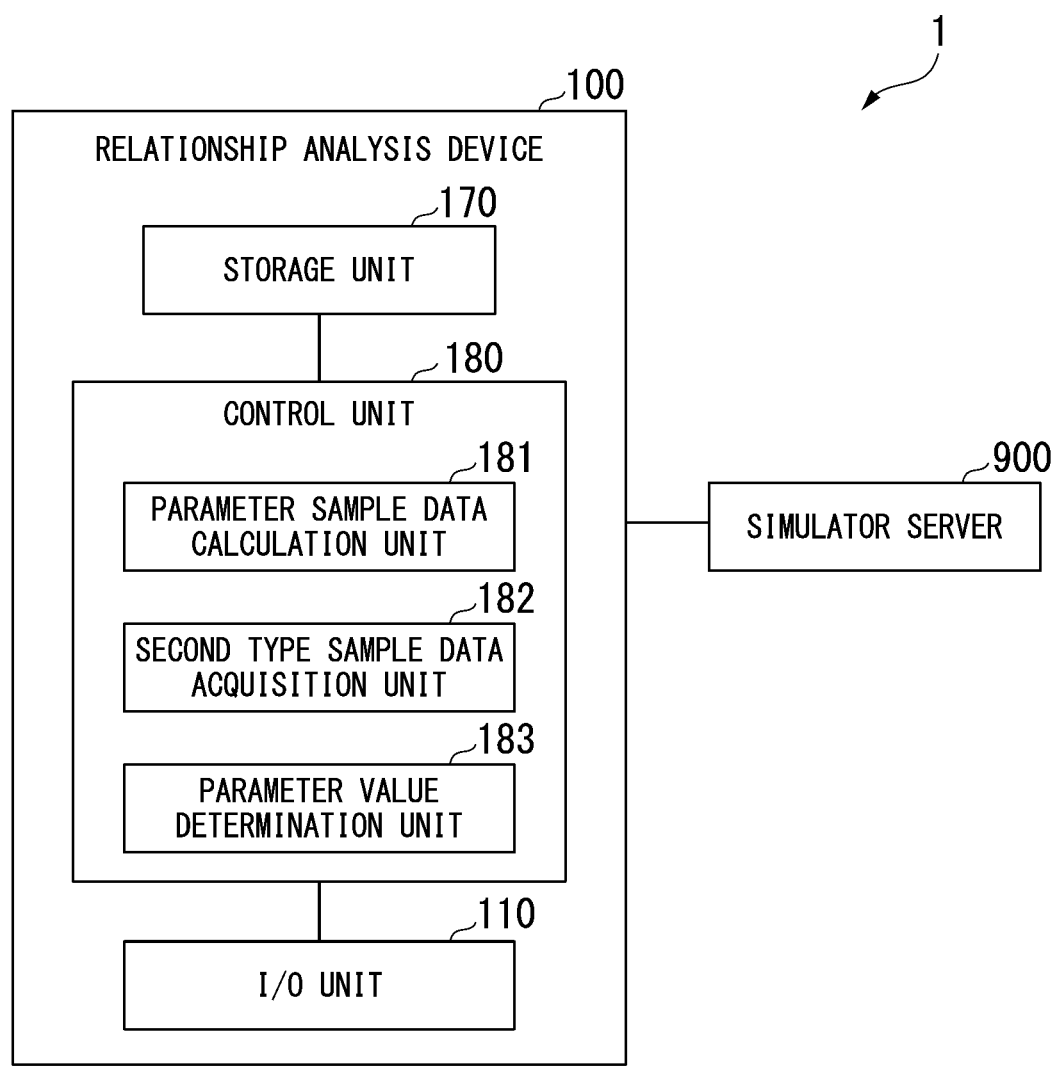
FIG. 1 is a schematic block diagram showing an example of a functional configuration of a relationship analysis device according to a first example embodiment.

FIG. 1 is a schematic block diagram showing an example of a functional configuration of a relationship analysis system according to a first example embodiment. In the configuration shown in FIG. 1, the relationship analysis system 1 includes a relationship analysis device 100 and a simulator server 900. The relationship analysis device 100 includes an I/O unit 110, a storage unit 170, and a control unit 180. The control unit 180 includes a parameter sample data calculation unit 181, a second type sample data acquisition unit 182, and a parameter value determination unit 183.

The relationship analysis device 100 performs relationship analysis. Specifically, the relationship analysis device 100, by determining the parameter value of the model of the relationship (for example, correlation) between data of a first type and data of a second type based on observation data, analyzes the relationship (for example, correlation) between the data.

The relationship analysis device 100 is configured by using a computer such as a personal computer (PC) or a workstation.

Hereinbelow, the data of the first type will be referred to as data X, and the data of the second type will be referred to as data Y. Letting the number of pieces of observation data be n (n is a positive integer), the observation data of the data X (observation data of the first type) are expressed as observation data $X^n$, and the observation data of the data Y (observation data of the second type) are expressed as observation data $Y^n$. Further, elements of the observation data $X^n$ are expressed as $X_n$, and elements of the observation data $Y^n$ are expressed as $Y_1, \ldots, Y_n$. As described above, the relationship analysis device 100 obtains observation data in which data $X_i$ (i is an integer of $1 \leq i \leq n$) and data $Y_i$ are associated with each other on a one-to-one basis (that is, observation data that can be plotted on the XY plane).

The observation data $X^n$ and $Y^n$ are not limited to specific types of data, and can be various data that are actually measured. The actual measurement method for obtaining the observation data is not limited to a specific method, and various methods such as counting or measurement by a person such as a user or sensing using a sensor can be employed.

For example, the elements of the observation data $X^n$ may represent the states of the constituent elements that constitute the observation target. The elements of the observation data $Y^n$ may represent the states observed with respect to the observation target using a sensor or the like. For example, when the user wants to analyze the productivity of a manufacturing factory, the observation data $X^n$ may represent the operating status of each facility in the manufacturing factory. The observation data $Y^n$ may represent the number of products manufactured on a line composed of a plurality of facilities.

The observation target and the observation data are not limited to the above-mentioned examples, and may be, for example, equipment at a processing factory or a construction system in the case of constructing a certain facility.

The relationship analysis device 100, given the observation data $X''$ and $Y''$, the simulator $r(x, \theta)$ provided by the simulator server 900, and the distribution $\pi(\theta)$ that is a prior distribution temporarily set for the parameter $\theta$, performs relationship analysis between data X and data Y.

The distribution $\pi(\theta)$ is set, for example, by the user of the relationship analysis device 100 with accuracy according to the knowledge of the simulation target.

The simulator server 900 provides the simulator $r(x, \theta)$. The simulator $r(x, \theta)$ provided by the simulator server 900 receives the setting of the value of the parameter $\theta$ and the input of the value of the data X to the variable x and outputs the value of the data Y. Whereas in general relationship analysis a differentiable function is used as a model, the relationship analysis device 100 the model function of the simulator $r(x, \theta)$ is not necessarily differentiable. For example, the simulator $r(x, \theta)$ is managed by a device other than the relationship analysis device 100, such as the simulator server 900, and the relationship analysis device 100 may transmit the value of the data X and the value of the parameter $\theta$ to this device, and receive the value of the data Y.

Alternatively, the relationship analysis device 100 may include the simulator $r(x, \theta)$ inside the relationship analysis device 100 itself. In this case, the regression function of the simulator may be unknown to the relationship analysis device 100, such as the simulator $r(x, \theta)$ being black-boxed.

Figure 2:
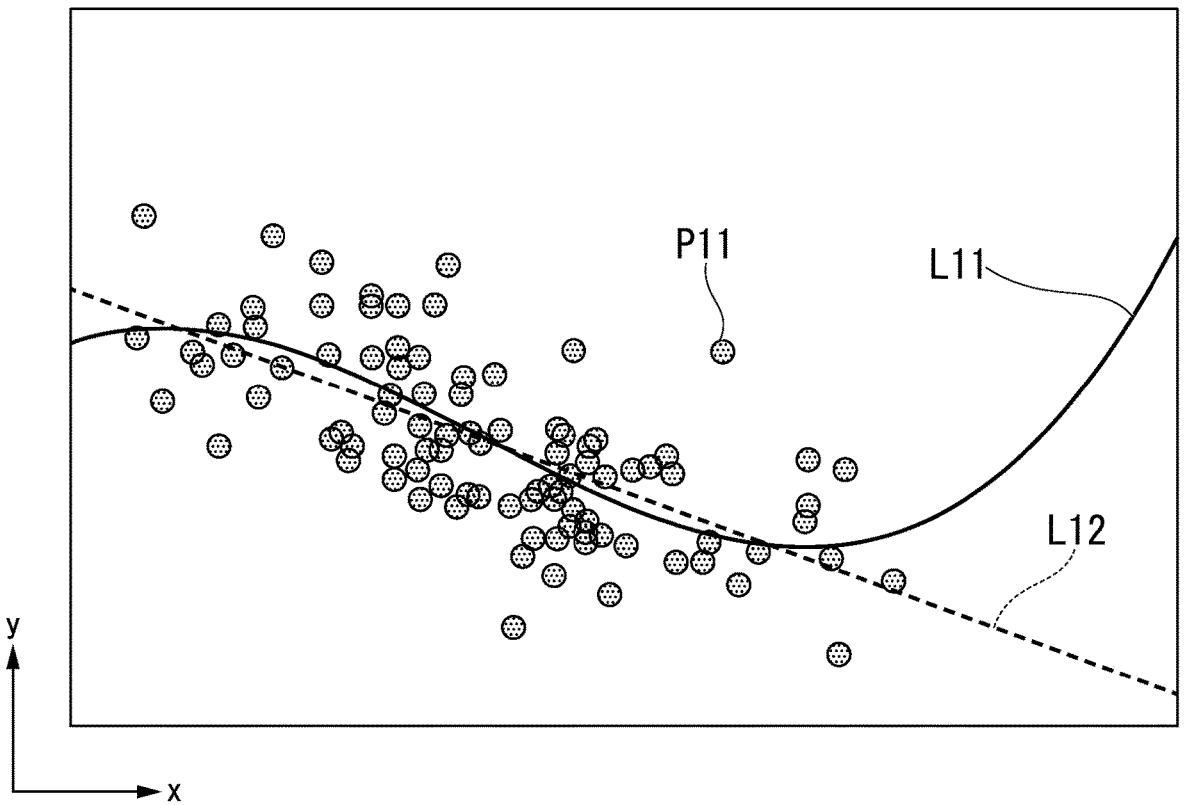
FIG. 2 is a diagram showing an example of setting a regression function by a simulator in the first example embodiment.

FIG. 2 is a diagram showing an example of setting a regression function by a simulator. In FIG. 2, the horizontal axis represents the X coordinate (data X coordinate), and the vertical axis represents the Y coordinate (data Y coordinate). In the following description, the term "regression function" will be used for convenience of description, but the term is not necessarily limited to a general (mathematic) "regression". For example, "regression" is used even when the model is unclear.

Line L11 shows a true model. Here, the function of the true model is assumed to be $y=R(x)$.

As described above, the true model (line L11) is not always represented by using a mathematical function (for example, a linear function, a quadratic function, an exponential function, a Gaussian function), and may simply represent the relationship between x and y for convenience. Furthermore, the true model does not have to be actually represented. Hereinafter, the term "function" will be used for convenience of description, but the term "function" will be used to mean a relationship.

Also, data indicated by circles such as point P11 are generated based on the true model. In the example of FIG. 2, the data contains noise, and each piece of data is plotted near the line L12.

The line L12 shows an example of a regression function obtained as a result of performing a mathematical regression analysis on x and y, which are inputs and outputs of the simulator, respectively. The simulator $r(x, \theta)$ provided by the simulator server 900 receives the setting of the value of the parameter $\theta$ and outputs the data Y according to the mathematical regression function exemplified by the line L12, for example. In other words, when the value of the data X is received in this state, the simulator $r(x, \theta)$ outputs the value of the data Y corresponding to the value of the input data X. In the case where the observation target is a factory, this expresses the fact that there is a relationship that statistically follows the regression function between the data X (for example, the state of equipment) input to the simulator and the output data Y (for example, the number of manufactured lines).

The relationship analysis device 100 calculates a parameter value corresponding to the observation data based on the observation data, and sets the calculated parameter value in the simulator. Thereby, the simulator outputs the value of the data Y in response to the input of the value of the data X. That is, the simulator can execute the simulation by setting the parameter value.

The I/O unit 110 performs input and output of data. In particular, the I/O unit 110 acquires observation data. For example, the I/O unit 110 may be configured using a sensor that monitors equipment, a device that counts the number of products, or the like. Alternatively, the I/O unit 110 may include a communication device and communicate with another device to transmit/receive data. Further, the I/O unit 110 may include an input device such as a keyboard and a mouse in addition to or instead of the communication device, and may receive data input by a user operation.

The storage unit 170 stores various data. The storage unit 170 is configured using a storage device included in the relationship analysis device 100.

The control unit 180 controls each unit of the relationship analysis device 100 to execute various processes. The control unit 180 is configured by a CPU (Central Processing Unit) provided in the relationship analysis device 100 reading a program from the storage unit 170 and executing the program.

The parameter sample data calculation unit 181 calculates a plurality of pieces of sample data of the parameter $\theta$ based on the distribution $\pi(\theta)$ temporarily set for the parameter $\theta$. The distribution $\pi(\theta)$ may be a distribution that follows a Gaussian distribution, or may be set using uniform random numbers in a certain numerical range. However, the distribution $\pi(\theta)$ is not limited to these examples. As described above, the parameter $\theta$ is a parameter of the simulator $r(x,\theta)$. The simulator $r(x, \theta)$ receives a value of the data of the first type (data X) and outputs a value of the data of the second type (data Y).

The second type sample data acquisition unit 182 inputs the observation data of the first type (observation data $X''$) and the sample data of the parameter $\theta$ to the simulator $r(x, \theta)$, and acquires the sample data of the second type (sample data of data Y) for each of the pieces of sample data of the parameter $\theta$.

The parameter value determination unit 183 calculates a weight for each of the pieces of sample data of the parameter $\theta$ based on the difference between the observation data of the second type (observation data $Y''$) and the sample data of the second type (the sample data of the data Y) acquired by the second type sample data acquisition unit 182, and calculates the value of the parameter $\theta$ using the obtained weight. The value of the parameter $\theta$ calculated by the parameter value determination unit 183 is a value determined by the relationship analysis device 100 to be an appropriate value of the parameter $\theta$ (a value for simulating the relationship between the data X and the data Y).

Figure 3:
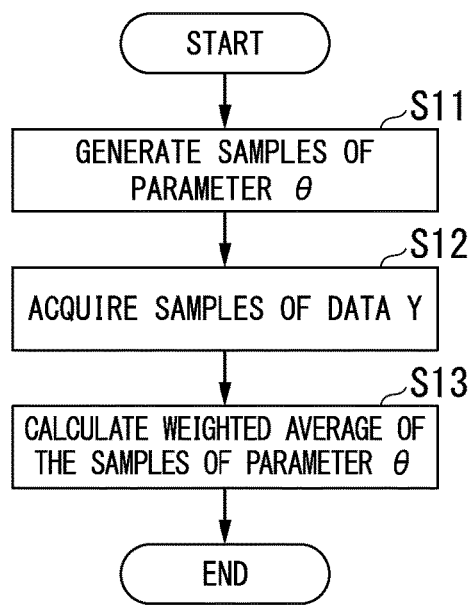
FIG. 3 is a flowchart showing an example of a procedure of processing performed by the relationship analysis device according to the first example embodiment.

FIG. 3 is a flowchart showing an example of a procedure of processing performed by the relationship analysis device 100 according to the first example embodiment.

(Step S11)

The parameter sample data calculation unit 181 generates sample data $\theta^{<1>}{}_j$ of the parameter $\theta$ based on a prior distribution of the parameter $\theta$ (distribution $\pi(\theta)$. <1> indicates data based on the prior distribution.

With the number of pieces of data to be generated being m (m is a positive integer), and j being an integer of 1≤j≤m, $\theta^{<1>}_j$ is expressed as in Expression (1).

[Expression 1]

$$\theta_j^{(1)} \in \text{Real}^{d_\theta} \sim \pi(\theta) \qquad (1)$$

$d_\theta$ denotes the number of dimensions of the parameter θ.

As shown in Expression (1), $\theta^{<1>}_j$ is represented as a $d_{74}$-dimensional real number and follows the distribution π(θ). The optimum parameter value is unknown at this point, and for example, the user estimates the distribution of the parameter θ based on the obtained information and registers it as the prior distribution π(θ).

After Step S11, the process proceeds to Step S12.

(Step S12)

The second type sample data acquisition unit 182 acquires the sample data $Y^{<1>n}_j$ corresponding to the observation data $X^n$ for each sample data $\theta^{<1>}_j$ obtained in Step S11. The second type sample data acquisition unit 182 inputs $\theta^{<1>}_j$ and $X^n$ to the simulator r(x, θ) and acquires $Y^{<1>n}_j$. The second type sample data acquisition unit 182 acquires the 20 sample data $Y^{<1>n}_j$ having n (the same number as the number of elements of the observation data $X^n$) elements for each sample data $\theta^{<1>}_j$. The elements of the observation data $X^n$ and the elements of the sample data $Y^{<1>n}_j$ are associated one-to-one with each other and can be plotted on the XY plane.

$Y^{<1>n}_j$ is expressed as in Expression (2).

$$Y_j^{(1)n} \in \text{Real}^n \sim p(y|X^n, \theta_j^{(1)}) \qquad \ldots (2)$$

As shown in Expression (2), $Y^{<1>n}_j$ is represented as an n-dimensional real number, and follows the distribution $p(y|X^n, \theta^{<1>}_j)$ obtained by inputting the observation data $X^n$ and the sample data $\theta^{<1>}_j$ to the learning model p(y|x,θ) of the simulator r(x,θ).

After Step S12, the process proceeds to Step S13.

(Step S13)

Based on $Y^{<1>n}_j$ obtained in Step S12 and the observation data $Y^n$, the parameter value determination unit 183 calculates a weight for each $\theta^{<1>}_j$ and calculates a weighted average.

The parameter value $\theta^{<2>}$ obtained by the weighted average is expressed as in Expression (3). <2> indicates that the data has already reflected the weight based on the comparison between $Y^{<1>n}_j$ and $Y^n$.

[Expression 3]

$$\theta^{(2)} = \sum_j \left( w_j \theta_j^{(1)} \right) \qquad (3)$$

The weight $w_j$ is expressed as in Expression (4).

[Expression 4]

$$w_j = k(Y^n, Y_j^{(1)n}) \qquad (4)$$

k is a function that calculates the proximity (norm) between $Y^{<1>n}_j$ and $Y^n$. A Gaussian kernel can be used as k, and is represented by Expression (5).

[Expression 5]

$$k(Y^n, Y_j^{(1)n}) = \exp\left\{-\frac{1}{2\sigma^2} \|Y^n - Y_j^{(1)n}\|^2\right\} \qquad (5)$$

The parameter value determination unit 183 increases the weight on the sample data $\theta^{<1>}_j$ as $Y^{<1>n}_j$ and $Y^n$ are closer to each other. That is, the parameter value determination unit 183 increases the weight for the sample data $\theta^{<1>}_j$ having a high likelihood (the sample data $\theta^{<1>}_j$ having a high accuracy of approximating the observation data $Y^n$).

After Step S13, the relationship analysis device 100 ends the process shown in FIG. 3.

The relationship analysis device 100 may update the parameter in the simulator using the weight determined by the parameter value determination unit 183. By performing such processing, a simulation with high prediction accuracy can be performed on the sample data of the second type.

As described above, the parameter sample data calculation unit 181 calculates a plurality of pieces of sample data $\theta^{<1>}_j$ of the parameter θ based on the distribution π(θ) temporarily set in relation to the parameter θ of the simulator r(x, θ) that receives input of the value of the data of the first type (data X) and outputs the value of the data of the second type (data Y). The second type sample data acquisition unit 182 inputs the observation data $X^n$ of the first type and the sample data $\theta^{<1>}_j$ of the parameter θ into the simulator r(x,θ), and acquires the sample data $Y^{<1>n}_j$ of the second type for each piece of sample data $\theta^{<1>}_j$ of the parameter θ. The parameter value determination unit 183 calculates a weight for each of the pieces of the sample data $\theta^{<1>}_j$ of the parameter θ based on the difference between the observation data $Y^n$ of the second type and the sample data $Y^{<1>n}_j$ of the second type that was calculated, and calculates the value $\theta^{<2>}$ of the parameter θ using the obtained weight.

As described above, in the relationship analysis device 100, by generating the sample data $\theta^{<1>}_j$ of the parameter θ of the simulator and inputting the generated sample data $\theta^{<1>}_j$ to the simulator and evaluating sample data, it is possible to determine the value of the parameter θ without having to differentiate the model function. The relationship analysis device 100 can perform relationship analysis even when the model function is not differentiable or when the model is unknown.

Second Example Embodiment

In the first example embodiment, an estimation value of the parameter θ is obtained as real values with having the $d_\theta$ dimension. On the other hand, in the second example embodiment, an example of obtaining an estimation value of the parameter θ by distribution will be described.

Figure 4:
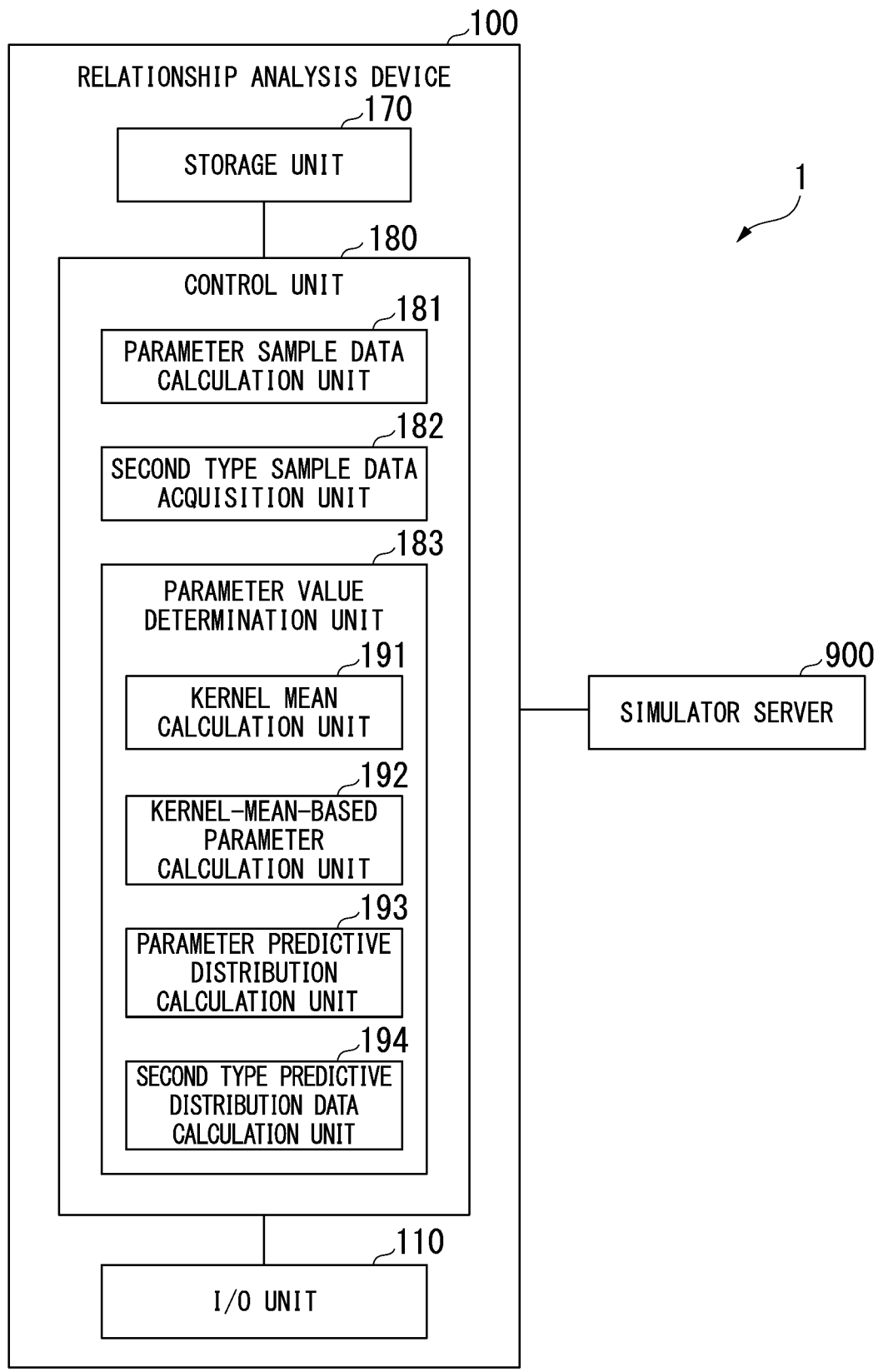
FIG. 4 is a schematic block diagram showing an example of a functional configuration of a relationship analysis device according to the second example embodiment.

FIG. 4 is a schematic block diagram showing an example of the functional configuration of the relationship analysis device according to the second example embodiment. A configuration shown in FIG. 4 is different from the configuration of FIG. 1 in that the parameter value determination unit 183 includes a kernel mean calculation unit 191, a kernel-mean-based parameter calculation unit 192, a parameter predictive distribution calculation unit 193, and a second type predictive distribution data calculation unit 194. The other configuration is similar to the case of FIG. 1.

The kernel mean calculation unit 191 calculates a kernel mean that indicates the posterior distribution of the parameter θ under the observation data $X^n$ of the first type and the sample data $Y^{<1>n}_j$ of the second type acquired by the second type sample data acquisition unit 182.

The kernel-mean-based parameter calculation unit 192 calculates sample data of the parameter θ based on the kernel mean calculated by the kernel mean calculation unit 191.

The parameter predictive distribution calculation unit 193 calculates the kernel expression of the predictive distribution of the parameter θ by using the sample data of the parameter θ based on the kernel mean calculated by the kernel mean calculation unit 191.

The second type predictive distribution data calculation unit 194 calculates sample data according to the predictive distribution of the data of the second type (data Y) using the kernel expression of the predictive distribution of the parameters calculated by the parameter predictive distribution calculation unit 193.

Figure 5:
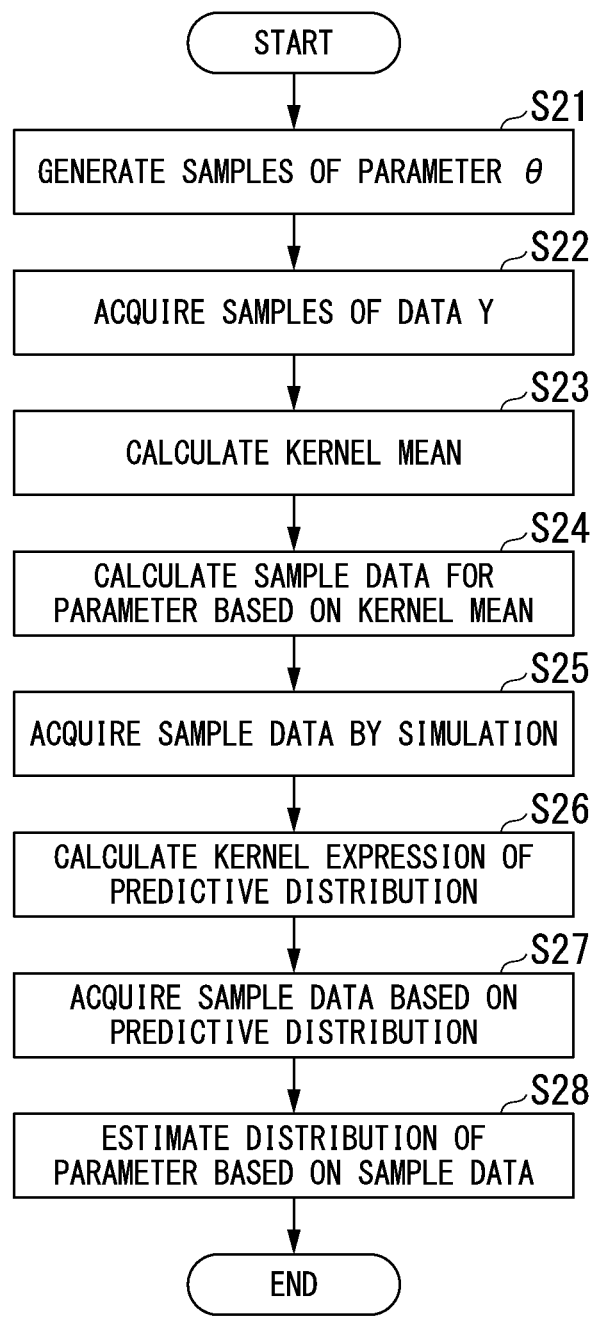
FIG. 5 is a flowchart showing an example of a procedure of processing performed by the relationship analysis device according to the second example embodiment.

FIG. 5 is a flowchart showing an example of the processing procedure performed by the relationship analysis device 100 according to the second example embodiment.

Steps S21 to S22 in FIG. 5 are the same as steps S11 to S12 in FIG. 3. After Step S22, the processing proceeds to Step S23.

(Step S23)

The kernel mean calculation unit 191 calculates the kernel mean.

The above Expression (3) can be expressed as Expression (6) by considering it as a formula for calculating the kernel mean. The kernel mean calculation unit 191 calculates the kernel mean $\hat{\mu}_{\theta|XY}$ based on Expression (6).

[Expression 6]

$$\hat{\mu}_{\theta|YX} = \sum_{j=1}^{m} w_j \theta_j^{(1)} \qquad (6)$$

The weight $w_j$ is expressed as in Expression (7).

[Expression 7]

$$w = (w_1, \ldots, w_m)^T \in \text{Real}^m = (G + m\delta I)^{-1} k_y(Y^n) \qquad (7)$$

Superscript T indicates transposition of matrix or vector. $k_y$ is shown as in Expression (8).

[Expression 8]

$$k_y(Y^n) = (k_y(Y_1^{<1>n}, Y^n), \ldots, k_y(Y_m^{<1>n}, Y^n))^T \in \text{Real}^m \qquad (8)$$

As $k_y$, the Gaussian kernel function shown in Expression (9) is used.

[Expression 9]

$$k_y(Y^n, Y^{n\prime}) = \exp\left\{-\frac{1}{2\sigma^2} \|Y^n - Y^{n\prime}\|^2\right\} \in \text{Real}^1 \qquad (9)$$

G denotes the Gramm matrix and is expressed as in Expression (10).

[Expression 10]

$$G = (k_y(Y_j^{<1>n}, Y_{j\prime}^{<1>n}))_{j,j\prime=1}^{m} \in \text{Real}^{m \times m} \qquad (10)$$

The kernel mean $\hat{\mu}_{\theta|XY}$ corresponds to the posterior distribution of θ under X and Y expressed in the Reproducing Kernel Hilbert Space (RKHS) by kernel mean embeddings.

After Step S23, the process proceeds to Step S24.

(Step S24)

The kernel-mean-based parameter calculation unit 192 calculates the sample data $\{\theta^{<3>}_1, \ldots, \theta^{<3>}_m\}$ (m being a positive integer indicating the sample number) based on the kernel mean $\hat{\mu}_{\theta|XY}$ for the parameter θ. <3> indicates that the data is based on the kernel mean.

Sample data based on the kernel mean can be recursively obtained using the kernel herding method. In this case, j is $0 \leq j \leq m$ (m being a positive integer indicating the sample number), and the kernel-mean-based parameter calculation unit 192 calculates the sample data $\theta^{<3>}_{j+1}$ based on Expression (11).

[Expression 11]

$$\theta_{j+1}^{<3>} = \text{argmax}_\theta h_j(\theta) \qquad (11)$$

$\text{argmax}_\theta h_j(\theta)$ indicates the value of θ that maximizes the value of $h_j(\theta)$.

$h_j$ is recursively indicated by Expression (12).

[Expression 12]

$$h_{j+1} = h_j + \mu - \theta_{j+1}^{<3>} \in H \qquad (12)$$

The kernel mean $\hat{\mu}_{\theta|XY}$ obtained in Step S23 is input into μ of Expression (12). Further, the initial value h0 of $h_j$ is set to $h_0 := \hat{\mu}_{\theta|XY}$.

H denotes the reproducing kernel Hilbert space.

Weight according to the closeness (norm) between the sample data $Y^{<1>n}_j$ based on the prior distribution and the observation data $Y^n$ is reflected in the sample data $\{\theta^{<3>}_1, \ldots, \theta^{<3>}_m\}$ obtained in Step S24.

After Step S24, the process proceeds to Step S25.

(Step S25)

The parameter predictive distribution calculation unit 193 inputs the observation data $X^n$ and the sample data $\theta^{<3>}_j$ to the simulator $r(x,\theta)$ to calculate, by simulation, $\{\theta^{<3>}_j, Y^{<3>n}_j\}$ following the distribution $p(y|X^n, \theta^{<3>}_j)$.

After Step S25, the process proceeds to Step S26.

(Step S26)

The parameter predictive distribution calculation unit 193 uses the sample data $\{\theta^{<3>}_j, Y^{<3>n}_j\}$ obtained in Step S25 to calculate the kernel representation $\hat{v}_{y|XY}$ of the predictive distribution of the data Y.

The kernel representation $\hat{v}_{y|YX}$ of the predictive distribution can be calculated using the Kernel Sum Rule. In this case, the predictive distribution $p(y|X_n, Y_n)$ is represented by Expression (13).

[Expression 13]

$$p(y|X^n, Y^n) = \int p(y|X^n, \theta) p(\theta|X^n, Y^n) d\theta \qquad (13)$$

The kernel expression $\hat{v}_{y|YX}$ of the predictive distribution $p(y|X_n, Y_n)$ is given as in Expression (14).

[Expression 14]

$$\hat{v}_{y|XY} = \sum_{j=1}^{m} v_j Y_j^{(3)n} \qquad (14)$$

$v_1, \ldots, v_m$ are shown as in Expression (15).

[Expression 15]

$$v = (v_1, \ldots, v_m)^T \in \text{Real}^m = (G_{\theta^{<3>}} + m\delta_m I)^{-1} G_{\theta^{<3>}\theta} w^T \qquad (15)$$

The Gram matrix $G_{\theta^{<3>}}$ is expressed as in Expression (16).

[Expression 16]

$$G_{\theta^{<3>}} = (k_\theta(\theta_j^{<3>}, \theta_{j\prime}^{<3>}))_{j,j\prime=1}^{m} \qquad (16)$$

The Gram matrix $G_{\theta<3>\theta}$ is expressed as in Expression (17).

[Expression 17]

$$G_{\theta<3>\theta}=(k_\theta(\theta_j^{<3>},\theta_j))_{j,j'=1}^m \quad (17)$$

$\delta_m$ is a coefficient for stabilizing the calculation of an inverse matrix.

I indicates the identity matrix.

After Step S26, the process proceeds to Step S27.

(Step S27)

The second type predictive distribution data calculation unit 194 obtains sample data $Y^{<4>n}_j$ based on the predictive distribution using the kernel expression $\hat{v}_{y|YX}$ of the predictive distribution obtained in Step S26.

<4> indicates that the data is based on the kernel expression of the predictive distribution.

Also in Step S27, sample data can be recursively obtained using the kernel herding method, as in Step S24. In Step S27, the sample data is calculated based on Expression (18).

[Expression 18]

$$Y_{j+1}^{<4>}=\text{argmax}_y h'_j(y) \quad (18)$$

$\text{argmax}_y h_j(y)$ indicates the value of y that maximizes the value of $h_j(y)$.

$h'_j$ is recursively shown by Expression (19).

[Expression 19]

$$h'_{j+1}=h'_j+v-Y_{j+1}^{<4>}\in H \quad (19)$$

The kernel expression $\hat{v}_{y|YX}$ of the predictive distribution obtained in Step S26 is input into v of Expression (19). Further, the initial value $h'_0$ of $h'_j$ is set to $h'_0:=\hat{v}_{y|YX}$.

After Step S27, the process proceeds to Step S28.

(Step S28)

The second type predictive distribution data calculation unit 194 calculates the distribution of the parameter θ based on the sample data $\{\theta_1^{<3>},\ldots,\theta_m^{<3>}\}$ obtained in Step S24. For example, the second type predictive distribution data calculation unit 194 assumes that the distribution of the parameter θ follows a specific distribution such as a Gaussian distribution, and calculates characteristic amounts of the distribution such as an average value and a variance from the sample data.

Alternatively, the relationship analysis device 100 may present the sample data of the parameter obtained in Step S24 to a user as is (for example, display in a graph). By referring to the sample data itself of the parameter, the user can determine the confidence interval and the reliability of the parameter itself calculated by the kernel-mean-based parameter calculation unit 192 with higher accuracy. In addition, when the sample data of the parameter cannot be captured with a specific distribution, for example, when the parameter distribution is multimodal or when the parameter distribution is asymmetric, the user can ascertain the distribution of the parameter by the relationship analysis device 100 presenting the sample data of the parameter to the user as is.

The second type predictive distribution data calculation unit 194 may calculate the distribution of the sample data $Y^{<4>n}_j$ of the data Y obtained in Step S27, in addition to or instead of the sample data of the parameter.

After Step S28, the relationship analysis device 100 ends the process of FIG. 5.

As described above, the kernel mean calculation unit 191 calculates the kernel mean $\hat{\mu}_{\theta|YX}$ indicating the posterior distribution of parameter θ under the observation data $X^n$ of the first type and the sample data $Y^{<1>n}_j$ of the second type acquired by the second type sample data acquisition unit 182. The kernel-mean-based parameter calculation unit 192 calculates the sample data $\{\theta_1^{<3>},\ldots,\theta_m^{<3>}\}$ of the parameter θ based on the kernel mean $\hat{\mu}_{\theta|YX}$ calculated by the kernel mean calculation unit 191. The parameter predictive distribution calculation unit 193 calculates the kernel expression $\hat{v}_{y|YX}$ of the predictive distribution of the data Y using the sample data $\{\theta_1^{<3>},\ldots,\theta_m^{<3>}\}$ of the parameter θ. The second type predictive distribution data calculation unit 194 calculates the sample data $Y^{<4>n}_j$ that follows the predictive distribution of the data of the second type (data Y) using the kernel expression $\hat{v}_{y|YX}$ of the predictive distribution of the data Y calculated by the parameter predictive distribution calculation unit 193.

By thus generating the sample data by the relationship analysis device 100, the data distribution can be calculated based on the sample data. The relationship analysis device 100 may calculate the data distribution. Alternatively, the relationship analysis device 100 may present the sample data to the user, and the user may calculate the data distribution.

Third Example Embodiment

In the third example embodiment, a case where the relationship analysis device is compatible with covariate shift will be described. Covariate shift means that input and output functions do not change even though the distribution of inputs differs between training and testing. Here, the case where the distribution of the data X of the observation data and the distribution of the data X of the relationship analysis target (range to be analyzed) differ but the true model does not change is treated as a covariate shift. The distribution of the data X of the observation data is expressed as $q_0(x)$, and the distribution of the data X of the relationship analysis target is expressed as $q_1(x)$.

Figure 6:
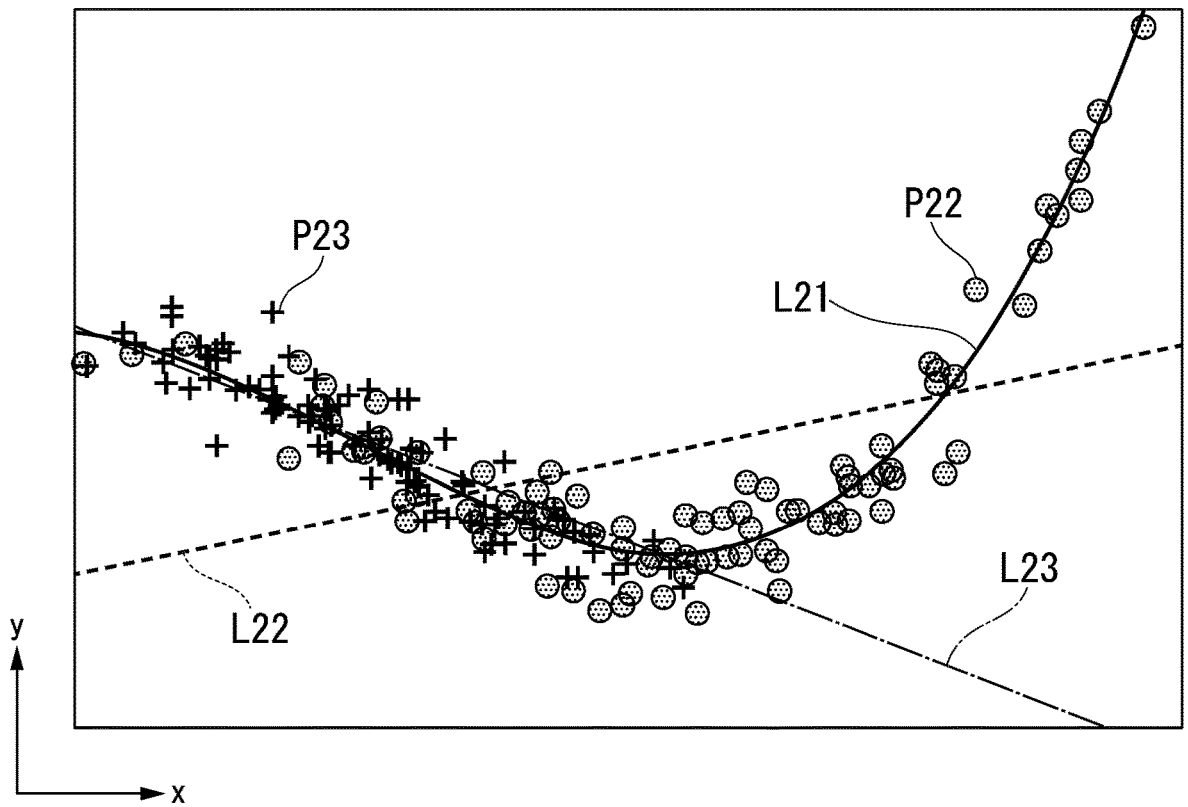
FIG. 6 is a diagram showing an example of a covariate shift in the second example embodiment.

FIG. 6 is a diagram showing an example of covariate shift. In FIG. 6, the horizontal axis represents the X coordinate (data X coordinate), and the vertical axis represents the Y coordinate (data Y coordinate).

The line L21 shows the true model. Here, the function of the true model is assumed to be y=R(x).

Also, both the data indicated by a circle like the point P22 and the data indicated by a cross like the point P23 are generated based on the true model. Data indicated by circles are called circle data, and data indicated by crosses are called cross data.

In the example of FIG. 6, noise is included in the data, and both the circle data and cross data are plotted near the line L21.

On the other hand, the circle data and the cross data have different distributions in the X-axis direction. The circle data are widely distributed to the left and right in FIG. 6, while the cross data are distributed on the left side of FIG. 6. Due to this difference in distribution, regression functions differ between the circle data and the cross data. For example, when linear regression is performed, the regression line for the circle data is line L22, while the regression line for the cross data is line L23.

In this way, even if the true model is the same, the regression functions may differ due to the difference in the distributions. For example, in the case of the obtained observation data being circle data, when the regression function is calculated based on this observation data (circle data), the line L22 is obtained. On the other hand, when the user wants to analyze the relationship in the case of the distribution of cross data, the accuracy is low if the line L22 is used as a regression function, and so it is desired to treat the line L23 as a regression function.

Therefore, the relationship analysis device 100 weights the observation data based on a comparison between the distribution of the data X in the case of observation data and the distribution of the data X in the range for which the relationship analysis is to be performed, and calculates the value of the parameter θ corresponding to the distribution of the data X in the range in which the relationship analysis is to be performed.

The configuration of the relationship analysis system and the configuration of the relationship analysis device 100 according to the third example embodiment are the same as in the case of the first example embodiment (FIG. 1). In the third example embodiment, the process performed by the parameter value determination unit 183 is different from that in the first example embodiment. In the third example embodiment, the parameter value determination unit 183 calculates a weight for each of the pieces of the sample data of the parameter based on a relationship between a first distribution and a second distribution. The first distribution is a distribution that the difference between the observation data $Y^n$ of the second type and the sample data $Y^{<1>n}_j$, of the second type, and the observation data $X^n$ of the first type follow. The second distribution is a distribution of the data of the first type and the distribution on a region for which a relationship is sought. The parameter value determination unit 183 calculates the value of the parameter using the obtained weight.

In the first example embodiment, the parameter value determination unit 183 calculates the weight based on the likelihood of the parameter sample data $\theta^{<1>}_j$, which is indicated by the closeness between the observation data $Y^n$ and the sample data $Y^{<1>n}_j$. In contrast, in the third example embodiment, the parameter value determination unit 183 weights each of the pieces of the sample data $\theta^{<1>}$ based on the degree of agreement with the distribution $d_1(x)$ of the observation data in addition to the likelihood of the sample data $\theta^{<1>}_j$.

Figure 7:
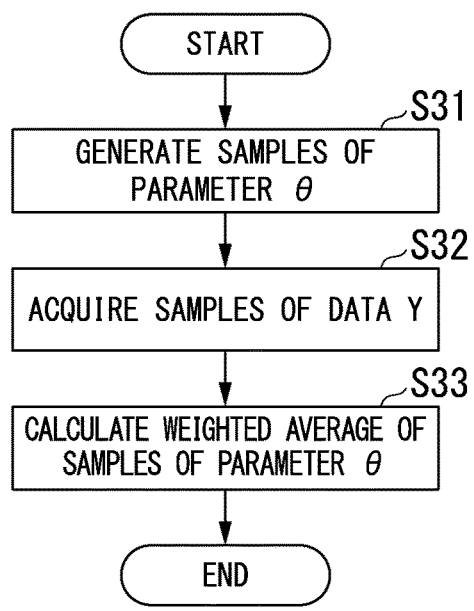
FIG. 7 is a flowchart showing an example of a procedure of processing performed by the relationship analysis device according to the third example embodiment.

FIG. 7 is a flowchart showing an example of the processing procedure performed by the relationship analysis device 100 according to the third example embodiment.

Steps S31 to S32 in FIG. 7 are the same as steps S11 to S12 in FIG. 3. After Step S32, the process proceeds to Step S33.

(Step S33)

The parameter value determination unit 183 calculates a weight for each piece of sample data $\theta^{<1>}_j$ of the parameter and calculates a weighted average. In Step S12 of FIG. 3, the parameter value determination unit 183 calculates the weight for each $\theta^{<1>}_j$ based on the sample data $Y^{<1>n}_j$ and the observation data $Y^n$. In contrast, in Step S33, the parameter value determination unit 183 calculates a weight based on the distribution $q_0(x)$ of the observation data $X^n$ and the distribution $q_1(x)$ indicating the region where regression is sought, in addition to the sample data $Y^{<1>n}_j$ and the observation data $Y^n$.

A parameter value $\theta^{<5>}$ obtained by weighted averaging is expressed as in Expression (20). <5> indicates data in which weight based on $Y^{<1>n}_j$, $Y^n$, $q_0(x)$, and $q_1(x)$ has been reflected.

[Expression 20]

$$\theta^{(5)} = \sum_j \left(w'_j \theta^{(1)}_j\right) \tag{20}$$

The weight $w'_j$ is expressed as in Expression (21).

[Expression 21]

$$w'_j = k'(Y^n, Y^{<1>n}_j) \tag{21}$$

k' is a function that calculates the closeness (norm) between $Y^{<1>n}_j$ and $Y^n$, and adds the degree of agreement to the distribution $q_1(x)$. An expression obtained by modifying a Gaussian kernel can be used as k', and is represented by Expression (22).

[Expression 22]

$$k'(Y^n, Y^{n'}_j) = \tag{22}$$

$$\exp\left\{-\frac{1}{2\sigma^2}\|\beta^n \circ (Y^n - Y^{n'}_j)\|^2\right\} = \exp\left\{-\frac{1}{2\sigma^2}\sum_{i=1}^{n}(\beta_i(Y_i - Y'_i))^2\right\}$$

$\beta_i$ is a function indicating the degree of agreement of each element of $X^n$ with the distribution $q_1(x)$, and is expressed as in Expression (23).

[Expression 23]

$$\beta_i = \beta(X_i) = \frac{q_1(X_i)}{q_0(X_i)} \tag{23}$$

The white circle operator indicates a Hadamard product, that is, the product of each element of a matrix or vector.

After Step S13, the relationship analysis device 100 ends the process of FIG. 7.

As described above, the parameter sample data calculation unit 181 calculates a plurality of pieces of sample data $\theta^{<1>}_j$ of the parameter θ based on the distribution $\pi(\theta)$ temporarily set in relation to the parameter θ of the simulator r(x, θ) that receives input of the value of the data of the first type (data X) and outputs the value of the data of the second type (data Y). The second type sample data acquisition unit 182 inputs the observation data $X^n$ of the first type and the sample data $\theta^{<1>}_j$ of the parameter θ into the simulator r(x,θ), and acquires the sample data $Y^{<1>n}_j$ of the second type for each piece of sample data $\theta^{<1>}_j$ of the parameter θ. The parameter value determination unit 183 calculates a weight for each of the pieces of the sample data of the parameter θ based on the difference between the observation data $Y^n$ of the second type and the sample data $Y^{<1>n}_j$ of the second type that was calculated, and the relationship between the first distribution $q_0(x)$ that the observation data $X^n$ of the first type follows and the second distribution $q_1(x)$ that is the distribution of the data of the first type and the distribution on a region for which a relationship is sought, and calculates the value of the parameter θ using the obtained weight.

Thereby, the relationship analysis device 100 can perform relationship analysis with higher accuracy in response to a covariate shift.

In the third example embodiment as in the case of the first example embodiment, in the relationship analysis device 100, by generating the sample data $\theta^{<1>}_j$ of the parameter θ of the simulator and inputting the generated sample data $\theta^{<1>}_j$ to the simulator to be evaluated, it is possible to determine the value of the parameter $\theta$ without having to differentiate the model function. The relationship analysis device 100 can perform relationship analysis even when the model function is not differentiable or when the model is unknown.

As described above, the relationship analysis device 100 allows relationship analysis in some areas by relationship analysis between a plurality of types of data even when the model is unknown.

Fourth Example Embodiment

In the third example embodiment, an estimation value of the parameter $\theta$ is obtained as real values with having the $d_\theta$ dimension. In contrast, in the fourth example embodiment, an example of obtaining an estimation value of the parameter $\theta$ by using distribution will be described.

The configuration of the relationship analysis system and the configuration of the relationship analysis device 100 according to the fourth example embodiment are the same as in the case of the second example embodiment (FIG. 4). In the fourth example embodiment, the process performed by the parameter value determination unit 183 is different from that in the first example embodiment. In the third example embodiment, the parameter value determination unit 183 calculates a weight for each of the pieces of the sample data of the parameter based on the difference between the observation data $Y^n$ of the second type and the sample data $Y^{<1>n}_j$ of the second type and the relationship between the first distribution that the observation data $X^n$ of the first type follows and the second distribution that is the distribution of the data of the first type and that is on the region for which a relationship is sought, and calculates the value of the parameter using the obtained weight.

Figure 8:
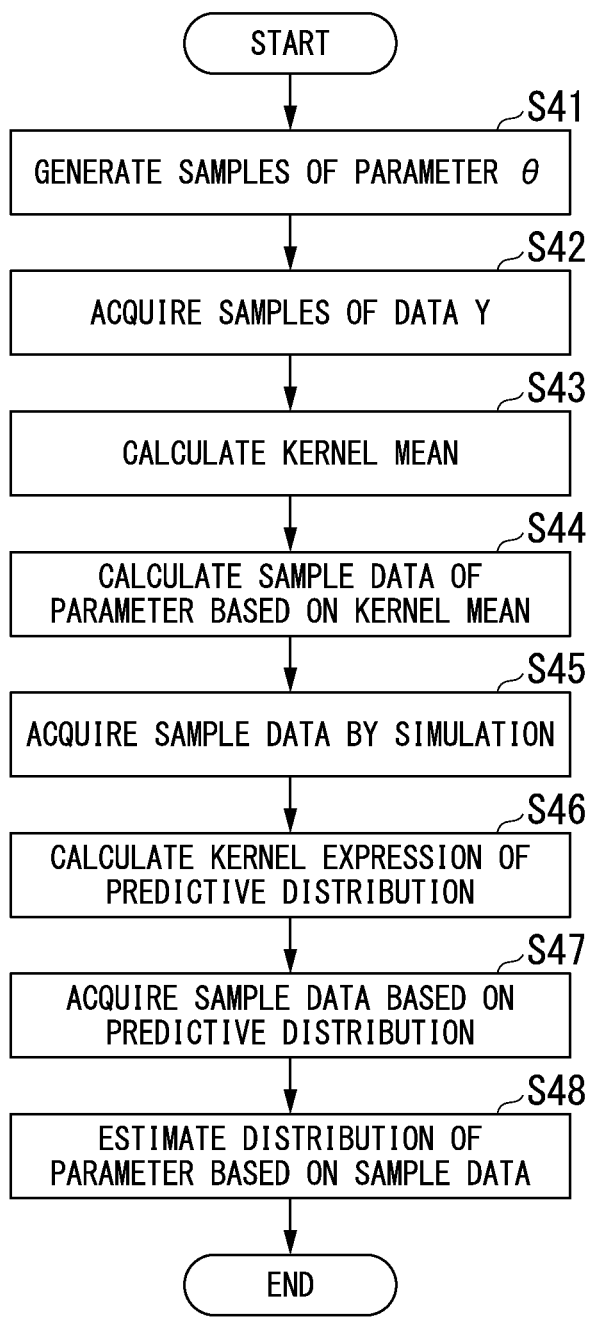
FIG. 8 is a flowchart showing an example of a procedure of processing performed by the relationship analysis device according to the fourth example embodiment.

FIG. 8 is a flowchart showing an example of the processing procedure performed by the relationship analysis device 100 according to the fourth example embodiment.

Steps S41 to S42 are the same as steps S11 to S12 in FIG. 2.

After Step S42, the process proceeds to Step S43.
(Step S43)
The kernel mean calculation unit 191 calculates the kernel mean.

The above Expression (20) can be expressed as Expression (24) by considering it as a formula for calculating the kernel mean. The kernel mean calculation unit 191 calculates the kernel mean $\hat{\mu}_{\theta<6>|XY}$ based on Expression (24). <6> indicates that the data is weighted based on the degree of conformance with the distribution $q_1(x)$.

[Expression 24]

$$\hat{\mu}_{\theta^{(6)}|YX} = \sum_{j=1}^{m} w_j^{(6)} \theta_j^{(1)} \qquad (24)$$

The weight $w^{<6>}_j$ is expressed as in Expression (25).

[Expression 25]

$$w^{<6>} = (w_1^{<6>}, \ldots, w_m^{<6>})^T \in \text{Real}^m = (G^{<6>} + m\delta I)^{-1} k_y^{<6>}(Y^n) \qquad (25)$$

$k^{<6>}_y(Y^n)$ is expressed as in Expression (26).

[Expression 26]

$$k_y^{<6>}(Y^n) = (k_y^{<6>}(Y_1^{<1>m}, Y^n), \ldots, k_y^{<6>}(Y_m^{<1>n}, Y^n))^T \in \text{Real}^m \qquad (26)$$

The Gram matrix $G^{<6>}$ is expressed as in Expression (27).

[Expression 27]

$$G^{<6>} = (k_y(Y_j^{<1>n}, Y_{j'}^{<1>n}))_{j,j'=1}^{m} \in \text{Real}^{m \times m} \qquad (27)$$

$k^{<6>}_y(Y^n, Y^m)$ is expressed as in Expression (28).

[Expression 28]

$$k_y^{(6)}(Y^n, Y^{n\prime}) = \exp\left\{-\frac{1}{2\sigma^2}\|Y^n - Y^{n\prime}\|^2\right\} = \qquad (28)$$
$$\exp\left\{-\frac{1}{2\sigma^2}\sum_{i=1}^{n}(\beta_i(Y_i - Y'_i))^2\right\}$$

Expression (28) corresponds to the weighted kernel function.

The kernel mean $\hat{\mu}_{\theta<6>|XY}$ corresponds to the posterior distribution of $\theta$ under X and Y that which was weighted based on the degree of agreement with the distribution $q_1(x)$ and expressed in reproducing kernel Hirbert space by kernel mean embedding.

After Step S43, the process proceeds to Step S44.
(Step S44)
The kernel-mean-based parameter calculation unit 192, for the parameter $\theta^{<6>}$, finds the sample data $\{\theta^{<6>}_1, \ldots, \theta^{<6>}_m\}$ based on the kernel mean $\hat{\mu}_{\theta<6>|XY}$, (m being a positive integer indicating the number of samples).

Sample data based on the kernel mean can be recursively obtained using the kernel herding method. In this case, the kernel-mean-based parameter calculation unit 192 calculates the sample data $\theta^{<6>}_{j+1}$ based on Expression (29), where j is $0 \leq j \leq m$ (m being a positive integer indicating the number of samples).

[Expression 29]

$$\theta_{j+1}^{<6>} = \text{argmax}_\theta h_j(\theta) \qquad (29)$$

$\text{argmax}_\theta h_j(\theta)$ indicates the value of $\theta$ that maximizes the value of $h_j(\theta)$.

$h_j$ is recursively indicated by Expression (30).

[Expression 30]

$$h_{j+1} = h_j + \mu - \theta_{j+1}^{<6>} \in H \qquad (30)$$

The kernel mean $\hat{\mu}_{\theta<6>|XY}$ obtained in Step S43 is input into $\mu$ of Expression (30). Further, the initial value $h_0$ of $h_j$ is set to $h_0 := \hat{\mu}_{\theta<6>|XY}$.

H denotes the reproducing kernel Hilbert space.

Weight according to the closeness between the sample data $Y^{<1>n}_j$ based on the prior distribution and the observation data $Y^n$ and weight based on the degree of agreement with the distribution $q_1(x)$ are reflected in the sample data $\{\theta^{<6>}_1, \ldots, \theta^{<6>}_m\}$ obtained in Step S24.

After Step S44, the process proceeds to Step S45.
(Step S45)
The parameter predictive distribution calculation unit 193 inputs the observation data $X^n$ and the sample data $\theta^{<6>}_j$ to the learning model $p(y|x,\theta)$ to calculate by simulation $\{\theta^{<6>}_j, Y^{<6>n}_j\}$ following the distribution $p(y|X^n, \theta\_mc^v_j)$.

After Step S45, the process proceeds to Step S26.
(Step S46)
The parameter predictive distribution calculation unit 193 uses the sample data $\{\theta^{<6>}_j, Y^{<6>n}_j\}$ obtained in Step S45 to calculate the kernel representation $\hat{v}_{y|XY}$ of the predictive distribution of the data Y corresponding to the distribution $q_1(x)$.

The kernel representation $v^{\wedge}_{y|XY}$ of the predictive distribution can be calculated using the Kernel Sum Rule. In this case, the predictive distribution $p(y|X^{<6>}{}_n, Y^{<6>}{}_n)$ is represented by Expression (31).

[Expression 31]

$$p(y|X^{<6>n}, Y^{<6>n}) = \int p(y|X^{<6>n}, \theta^{<6>}|X^{<6>n}, Y^{<6>n}) d\theta^{<6>} \quad (31)$$

The kernel expression $v^{\wedge}_{y|XY}$ of the predictive distribution $p(y|X_n, Y_n)$ is given as in Expression (32).

[Expression 32]

$$v^{\wedge}_{y|XY} = \sum_{j=1}^{m} v_j Y_j^{(6)n} \quad (32)$$

$v_1, \ldots, v_m$ are shown as in Expression (33).

[Expression 33]

$$v = (v_1, \ldots, v_m)^T \in \text{Real}^m = (G_{\theta^{<6>}} = (k_\theta(\theta_j^{<6>}, \theta_{j'}^{<6>}))_{j,j'=1}^{m} \quad (34)$$

The Gram matrix $G_{\theta<6>}$ is expressed as in Expression (34).

[Expression 34]

$$G_{\theta^{<6>}} = (k_\theta(\theta_j^{<6>}, \theta_{j'}^{<6>}))_{j,j'=1}^{m} \quad (34)$$

The Gram matrix $G_{\theta<6>\theta}$ is expressed as in Expression (35).

[Expression 35]

$$G_{\theta^{<6>}\theta} = (k_\theta(\theta_j^{<6>}, \theta_{j'}))_{j,j'=1}^{m} \quad (35)$$

$\delta_m$ is a coefficient for stabilizing the calculation of the inverse matrix.

I indicates the identity matrix.

After Step S46, the process proceeds to Step S47.
(Step S47)

The second type predictive distribution data calculation unit 194 obtains sample data in the predictive distribution $Y^{<6>n}{}_j$ using the kernel expression $v^{\wedge}_{y|YX}$ of the predictive distribution obtained in Step S46.

Also in Step S47, sample data can be recursively obtained using the kernel herding method, as in Step S44. In Step S47, the sample data is calculated based on Expression (36).

[Expression 36]

$$Y_{j+1}^{<6>} = \text{argmax}_y h'_j(y) \quad (36)$$

$\text{argmax}_y h'_j(y)$ indicates the value of y that maximizes the value of $h'_j(y)$.

$h'_j$ is recursively shown by Expression (37).

[Expression 37]

$$h'_{j+1} = h'_j + v - Y_{j+1}^{<6>} \in H \quad (37)$$

The kernel expression $v^{\wedge}_{y|YX}$ of the predictive distribution obtained in Step S46 is input into v of Expression (37). Further, the initial value $h'_0$ of $h'_j$ is set to $h'_0 := v^{\wedge}_{y|YX}$.

After Step S47, the process proceeds to Step S48.
(Step S28)

The second type predictive distribution data calculation unit 194 calculates the distribution of the parameter θ from the sample data $\{\theta^{<6>}{}_1, \ldots, \theta^{<6>}{}_m\}$ obtained in Step S44. For example, the second type predictive distribution data calculation unit 194 assumes that the distribution of the parameter θ follows a specific distribution such as a Gaussian distribution, and calculates characteristic amounts of the distribution such as an average value and a variance based on the sample data.

Alternatively, the relationship analysis device 100 may present the sample data obtained in Step S44 to a user as is (for example, display in a graph). By referring to the sample data itself, the user can determine a confidence interval and reliability of the data itself with higher accuracy. In addition, when the sample data cannot be captured with a specific distribution, such as a case of there being multiple peaks in the data or the distribution being asymmetric, the user can ascertain the distribution of the data by the relationship analysis device 100 presenting the sample data to the user as is.

The second type predictive distribution data calculation unit 194 may calculate the distribution of the sample data $Y^{<6>n}{}_j$ of the data Y obtained in Step S47, in addition to or instead of the sample data of the parameter.

After Step S48, the relationship analysis device 100 ends the process of FIG. 8.

As described above, the kernel mean calculation unit 191 calculates the kernel mean $\mu^{\wedge}_{\theta|XY}$ indicating the posterior distribution of parameter θ under the observation data $X^n$ of the first type and the sample data $Y^{<1>n}{}_j$ of the second type acquired by the second type sample data acquisition unit 182. The kernel-mean-based parameter calculation unit 192 calculates the sample data $\{\theta^{<6>}{}_1, \ldots, \theta^{<6>}{}_m\}$ of the parameter θ based on the kernel mean $\mu^{\wedge}_{\theta|XY}$ calculated by the kernel mean calculation unit 191. The parameter predictive distribution calculation unit 193 calculates the kernel expression $v^{\wedge}_{y|YX}$ of the predictive distribution of the data Y using the sample data $\{\theta^{<6>}{}_1, \ldots, \theta^{<6>}{}_m\}$ of the parameter θ. The second type predictive distribution data calculation unit 194 calculates the sample data $Y^{<6>n}{}_j$ that follows the predictive distribution of the data of the second type (data Y) using the kernel expression $v^{\wedge}_{y|YX}$ of the predictive distribution calculated by the parameter predictive distribution calculation unit 193.

By thus generating the sample data by the relationship analysis device 100, the data distribution can be found based on the sample data. The relationship analysis device 100 may calculate the data distribution. Alternatively, the relationship analysis device 100 may present the sample data to the user, and the user may find the data distribution.

Next, an operation experiment of the relationship analysis device 100 will be described.

Figure 9:
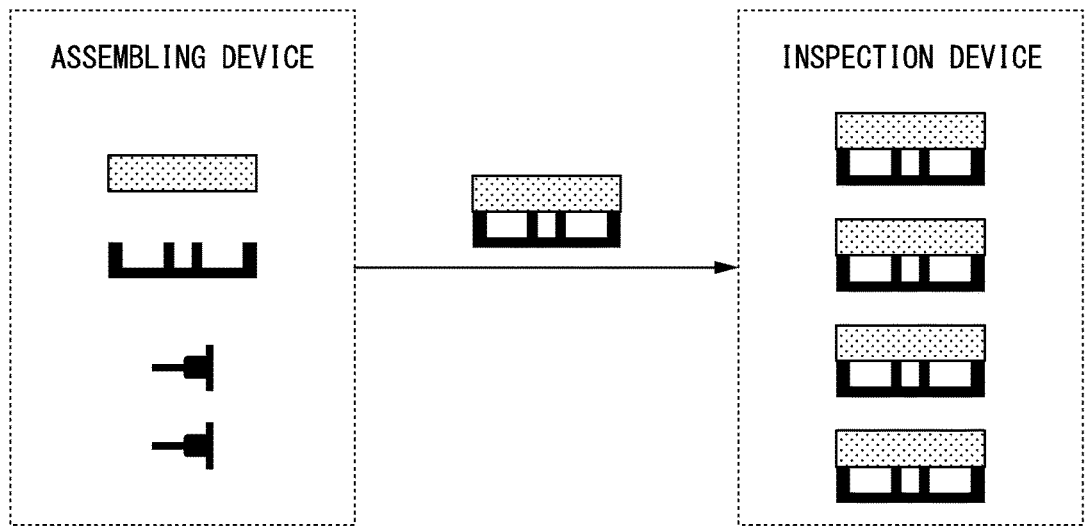
FIG. 9 is a diagram showing an example of the assembly process of a simulation target in an experiment according to the example embodiment.

FIG. 9 is a drawing showing an example of an assembly process of a simulation target in an experiment. In the assembly process shown in FIG. 9, an assembling device assembles the four parts of an upper part, a lower part, and two screws to produce a product. The product assembled by the assembling device is conveyed to an inspection device. The inspection device performs an inspection when obtaining four products.

In this assembly process, the amount of products produced per unit time is assumed to be data X, and the shipping time of X products (the value of data X) is assumed to be data Y. Further, it is assumed that the number of parameters is 2, the working time of the assembling device is $\theta_1$, and the working time of the inspection device is $\theta_2$.

Figure 10:
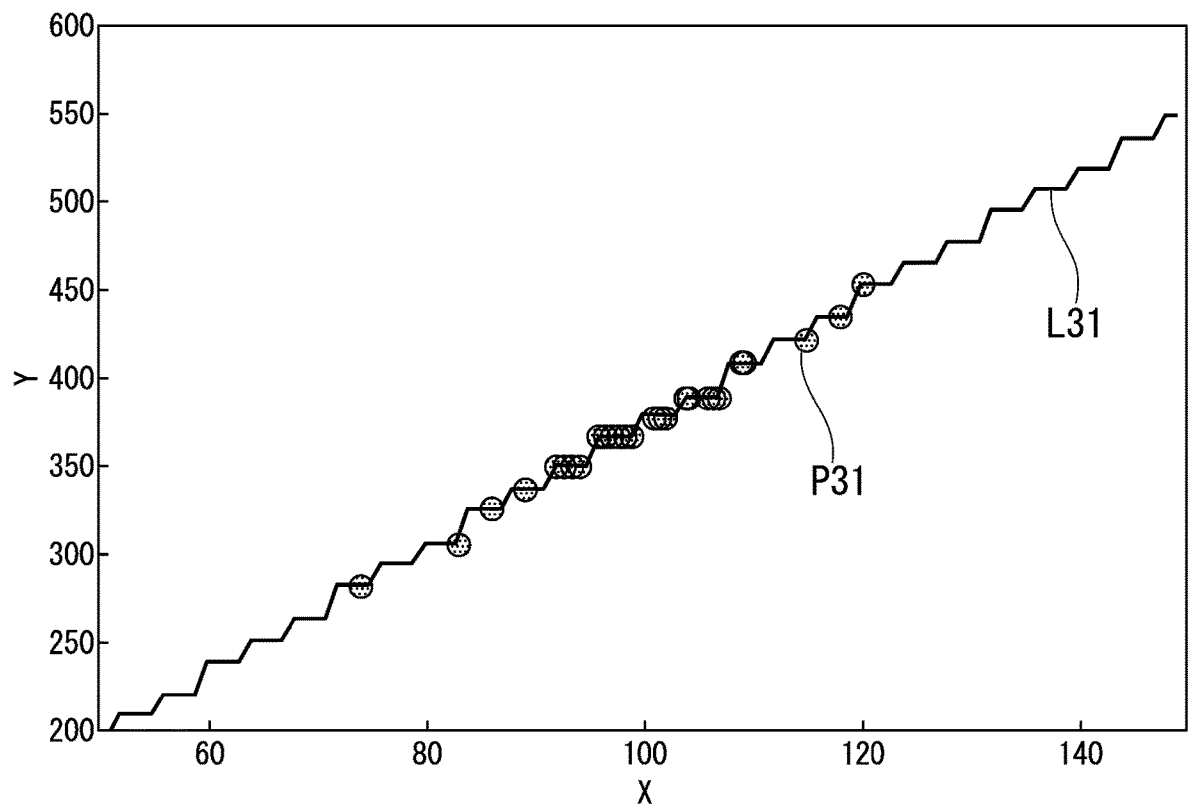
FIG. 10 is a diagram showing the relationship between X and Y obtained in the experiment according to the example embodiment.

FIG. 10 is a diagram showing the obtained relationship between X and Y. The horizontal axis of the graph in FIG. 10 represents data X, and the vertical axis represents data Y. Also, the observation data is indicated by a circle such as the point P31.

The line L31 is a line showing the relationship between X and Y obtained as a result of the relationship analysis.

The line L31 is considered to have a stepwise shape due to a waiting time that arises as a result of the inspection device inspecting the four products upon being conveyed, with the relationship between X and Y being accurately determined.

Figure 11:
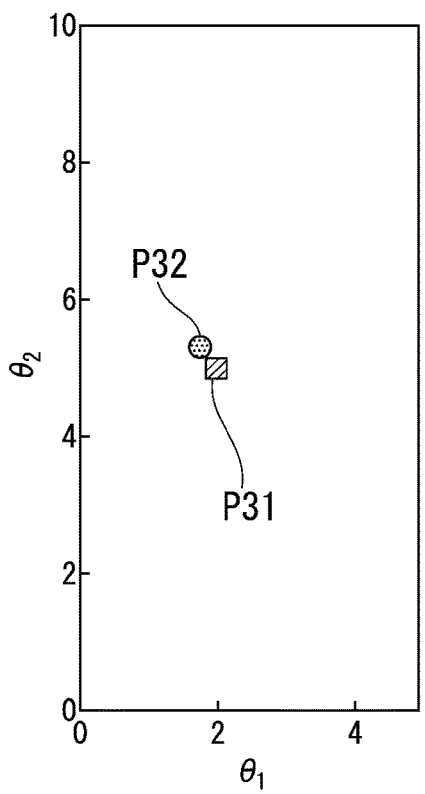
FIG. 11 is a diagram showing values of parameters obtained by experiments according to the example embodiment.

FIG. 11 is a diagram showing parameter values obtained in the experiment. The horizontal axis of the graph in FIG. 11 represents the parameter $\theta_1$ and the vertical axis represents the parameter $\theta_2$.

Point P31 indicates the true value of the parameters. Point P32 indicates the parameter values obtained in the experiment. The point P32 is close to the point P31, and so the parameter values can be calculated appropriately.

Figure 12:
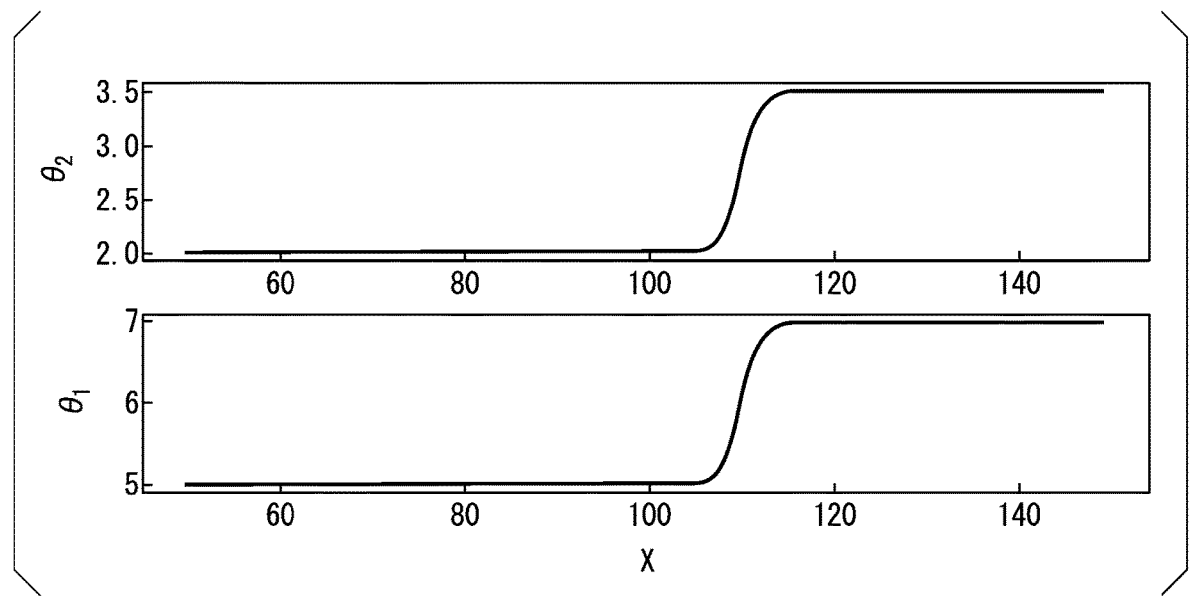
FIG. 12 is a diagram showing an example of setting parameter values in a covariate shift experiment according to the example embodiment.

FIG. 12 is a diagram showing an example of setting parameter values in a covariate shift experiment.

In the experiment of the above-mentioned assembly process simulation, if the value of X exceeds 110, the true parameter values are set so that both $\theta_1$ and $\theta_2$ have large values (more time is required for assembly and inspection).

Figure 13:
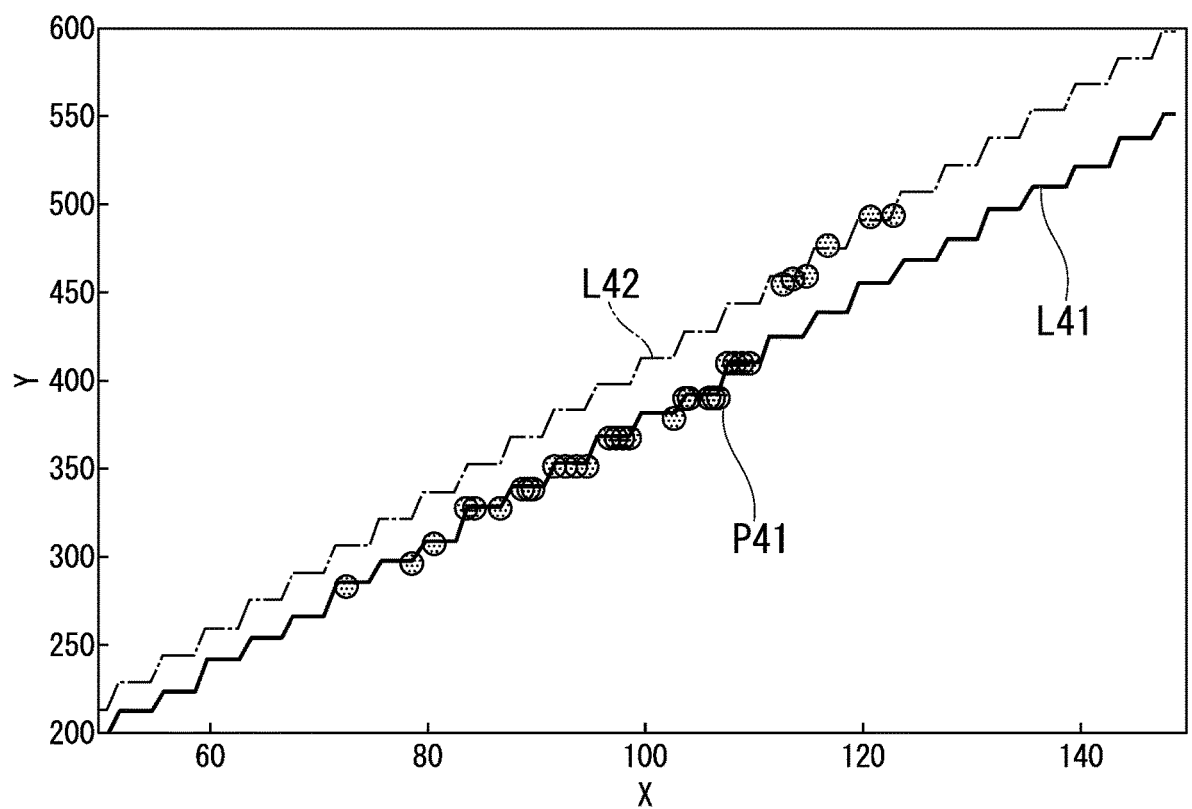
FIG. 13 is a diagram showing the relationship between X and Y obtained in the covariate shift experiment according to the example embodiment.

FIG. 13 is a diagram showing the relationship between X and Y obtained in the experiment. The horizontal axis of the graph in FIG. 13 represents the data X, and the vertical axis represents the data Y. Further, the observation data is indicated by circles such as point P41.

While the distribution of the observation data is $q_0(X)=N(X|100,10)$ centered around X=100, the case to be predicated is X=120, such as the region to be predictive is $q_1(X)=N(X|120,10)$.

The line L41 is a line showing the relationship between X and Y obtained when the covariate shift process is not performed. The line L42 is a line showing the relationship between X and Y obtained when the covariate shift is performed.

The line L41 without the covariate shift accurately approximates the data around X=100, while the line L42 with the covariate shift accurately approximates the data around X=120. In this way, results of the covariate shift were obtained.

Also, as in the case of FIG. 10, a stepwise line is obtained, and in this respect also, the relationship between X and Y can be obtained with high accuracy.

Figure 14:
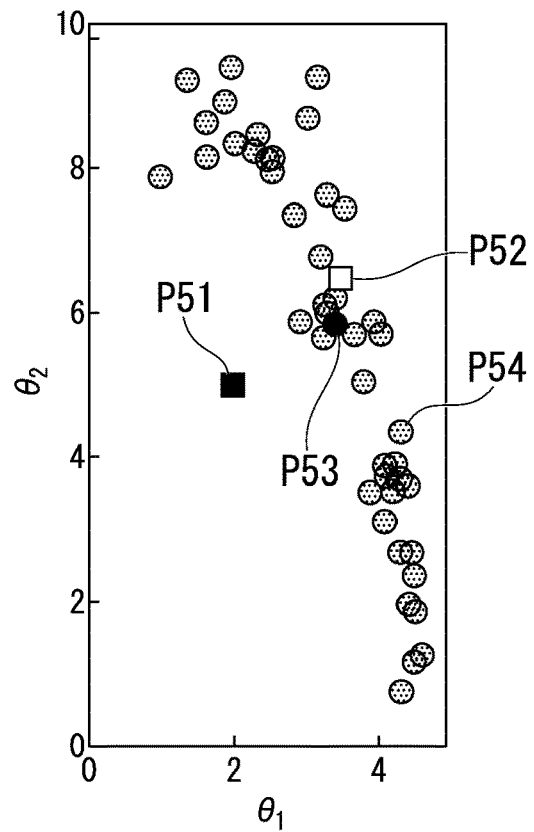
FIG. 14 is a diagram showing parameter values obtained in an experiment of covariate shift according to the example embodiment.

FIG. 14 is a diagram showing the values of the parameters obtained in the covariate shift experiment. The horizontal axis of the graph in FIG. 11 represents the parameter $\theta_1$ and the vertical axis represents the parameter $\theta_2$.

Point P51 indicates the true values of the parameters. Point P52 indicates the true value of the parameter due to the covariate shift. Point P53 shows the value of the parameter obtained by the covariate shift. The distribution of the parameter values obtained by kernel herding is indicated by point P54 and the like.

The point P53 is close to the point P52, and the parameter value can be calculated appropriately.

Also, the distribution of parameter values obtained by kernel herding has a large vertical distribution. This indicates that the influence of the value of the parameter $\theta_2$ is greater than the influence of the value of the parameter $\theta_1$. The distribution of the parameter values obtained by kernel herding is rising to the left. This shows that if the value of the parameter $\theta_1$ is improved, some improvement in efficiency is expected.

As described above, sensitivity analysis such as bottleneck analysis can be performed with reference to the distribution of the parameter values obtained by the relationship analysis device 100.

Next, a configuration of the example embodiment of the present invention will be described with reference to FIG. 15.

Figure 15:
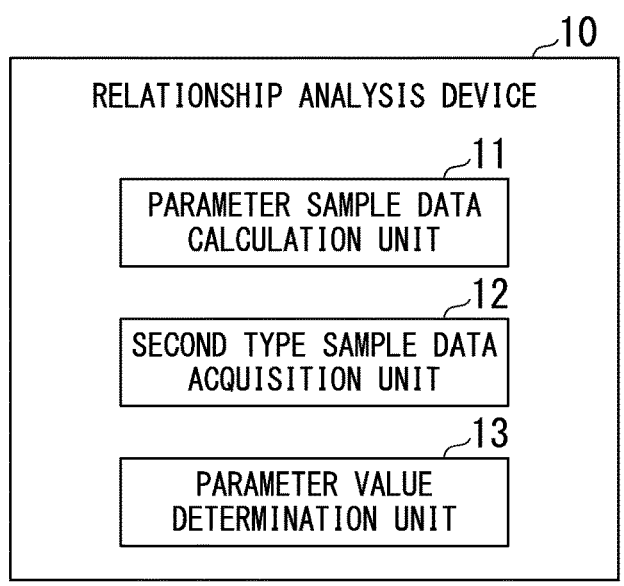
FIG. 15 is a diagram showing an example of a configuration of a relationship analysis device according to an example embodiment of the present invention.

FIG. 15 is a diagram showing an example of the configuration of the relationship analysis device according to the example embodiment of the present invention. The relationship analysis device 10 shown in FIG. 15 includes a parameter sample data calculation unit 11, a second type sample data acquisition unit 12, and a parameter value determination unit 13.

With such a configuration, the parameter sample data calculation unit 11 calculates a plurality of pieces of sample data for parameters for a simulator that receives inputs of data of a first type and outputs a data of a second type, calculating the sample data based on a temporarily set distribution for the parameters. The second type sample data acquisition unit 12 inputs, to the simulator, observation data of the first type and each of a plurality of pieces of sample data for the parameters and obtains sample data of the second type for each of the plurality of pieces of sample data for the parameters. The parameter value determination unit 13 calculates a weight for each of the plurality of pieces of sample data for the parameters based on the difference between the observation data of the second type and the sample data of the second type, and based on the relationship between a first distribution that the observation data of the first type followed and a second distribution being a distribution of the data of the first type and indicating a region for which a relationship is to be found, and calculates a value for the parameters using the calculated weight.

Thereby, the relationship analysis device 10 can perform relationship analysis with higher accuracy in response to the covariate shift.

In this way, in the relationship analysis device 10, by generating the sample data for the parameters of the simulator and inputting the generated sample data to the simulator for evaluation, the value of the parameters is determined without the need to differentiate the model function. In this respect, the relationship analysis device 10 can deal with relationship analysis even when the model function is not differentiable or the model is unknown.

As described above, according to the relationship analysis device 10, when a relationship in a partial area is analyzed by a relationship analysis between data of a plurality of types, it is possible to deal with a case where the model is unknown.

It should be noted that the process of each unit may be performed by recording a program for executing all or some of the functions of the control unit 180 in a computer-readable recording medium, reading the program recorded in this recording medium into a computer system and executing the program. It should be noted that the "computer system" mentioned here includes an OS and hardware such as peripheral devices.

The "computer-readable recording medium" refers to a portable medium such as a flexible disk, a magneto-optical disk, a ROM, a CD-ROM, or a storage device such as a hard disk built in a computer system. Further, the above-mentioned program may be one for realizing some of the above-mentioned functions, and may be one that can realize the above-mentioned functions in combination with a program already recorded in the computer system.

Although example embodiments of the present invention have been described in detail above with reference to the drawings, the specific configuration is not limited to these example embodiments, and designs or the like within a scope not departing from the gist of the present invention are also included.

INDUSTRIAL APPLICABILITY

The present invention may be applied to a relationship analysis device, a relationship analysis method, and a recording medium.

REFERENCE SYMBOLS

100: Relationship analysis device
110: I/O unit
170: Storage unit
180: Control unit
181: Parameter sample data calculation unit
182: Second type sample data acquisition unit
183: Parameter value determination unit
191: Kernel mean calculation unit
192: Kernel-mean-based parameter calculation unit
193: Parameter predictive distribution calculation unit
194: Second type predictive distribution data calculation unit

The invention claimed is:

1. A relationship analysis device for training a machine learning model, the relationship analysis device comprising:
at least one memory configured to store instructions; and
at least one processor configured to execute the instructions to:
calculate a plurality of pieces of sample data for parameters for a simulator, based on a temporarily set distribution for the parameters, the simulator including a non-differentiable function, receiving inputs of data of a first type and outputting data of a second type;
input, to the simulator, observation data of the first type and each of the plurality of pieces of sample data for the parameters, and obtain a sample data of the second type for each of the plurality of pieces of sample data for the parameters;
calculate a weight for each of the plurality of pieces of sample data for the parameters based on a difference between observation data of the second type and the sample data of the second type, and based on the relationship between a first distribution that the observation data of the first type followed and a second distribution being a distribution of the data of the first type and indicating a region for which a relationship is to be found, wherein the region indicated by the second distribution is used to improve accuracy in response to a covariate shift in the data of the first type;
calculate a value for the parameters using the calculated weight;
calculate a kernel mean in which the degree of agreement of each element of the data of the first type with the second distribution is reflected in a posterior distribution of the parameters under the observation data of the first type and the calculated sample data of the second type;
recursively calculate sample data of the parameters based on the kernel mean using kernel herding method; and
present the observation data of the first type, the observation data of the second type, and the calculated sample data on a display to a user.

2. The relationship analysis device according to claim 1, wherein the at least one processor is configured to execute the instructions to:
calculate a kernel expression of the predictive distribution of the parameters using sample data of the parameters based on the kernel mean; and
calculate sample data according to the predictive distribution of the data of the second type by using the kernel expression of the predictive distribution of the parameters.

3. A relationship analysis method for training a machine learning model, the relationship analysis method comprising:
calculating a plurality of pieces of sample data for parameters for a simulator that includes a non-differentiable function, receives inputs of data of a first type and outputs data of a second type, calculating the of pieces of sample data based on a temporarily set distribution for the parameters;
inputting, to the simulator, observation data of the first type and a plurality of pieces of sample data for the parameters, and calculating sample data of the second type for each of the plurality of pieces of sample data for the parameters;
calculating a weight for each of the plurality of pieces of sample data for the parameters based on a difference between observation data of the second type and the sample data of the second type, and based on the relationship between a first distribution that the observation data of the first type followed and a second distribution being a distribution of the data of the first type and indicating a region for which a relationship is to be found, wherein the region indicated by the second distribution is used to improve accuracy in response to a covariate shift in the data of the first type;
calculating a value for the parameters using the calculated weight;
calculating a kernel mean in which the degree of agreement of each element of the data of the first type with the second distribution is reflected in a posterior distribution of the parameters under the observation data of the first type and the calculated sample data of the second type;
recursively calculating sample data of the parameters based on the kernel mean using kernel herding method; and
presenting the observation data of the first type, the observation data of the second type, and the calculated sample data on a display to a user.

4. A non-transitory recording medium that records, for training a machine learning model, a program for causing a computer to execute:
calculating a plurality of pieces of sample data for parameters for a simulator that includes non-differentiable function, receives inputs of data of a first type and outputs data of a second type, calculating the plurality of pieces of sample data based on a temporarily set distribution for the parameters;
inputting, to the simulator, observation data of the first type and a plurality of pieces of sample data for the parameters, and calculating sample data of the second type for each of the plurality of pieces of sample data for the parameters;
calculating a weight for each of the plurality of pieces of sample data for the parameters based on a difference between observation data of the second type and the sample data of the second type, and based on the relationship between a first distribution that the observation data of the first type followed and a second distribution being a distribution of the data of the first type and indicating a region for which a relationship is to be found, wherein the region indicated by the second distribution is used to improve accuracy in response to a covariate shift in the data of the first type;

calculating a value for the parameters using the calculated weight;

calculating a kernel mean in which the degree of agreement of each element of the data of the first type with the second distribution is reflected in a posterior distribution of the parameters under the observation data of the first type and the calculated sample data of the second type;

recursively calculating sample data of the parameters based on the kernel mean using kernel herding method; and presenting the observation data of the first type, the observation data of the second type, and the calculated sample data on a display to a user.

5. The relationship analysis device according to claim 1, wherein the at least one processor is configured to execute the instructions to estimate distribution of the parameters based on the recursively calculated sample data.

6. The relationship analysis device for training the machine learning model according to claim 1, wherein the calculating the weight includes calculating the parameters in the machine learning model.

* * * * *